United States Patent [19]
Lasky et al.

[11] Patent Number: 6,121,064
[45] Date of Patent: Sep. 19, 2000

[54] STI FILL FOR SOI WHICH MAKES SOI INSPECTABLE

[75] Inventors: Jerome B. Lasky, Essex Junction; Bret Philips, Fairfax; Anthony C. Speranza, Essex Junction; Justin Wong, So. Burlington; Mickey H. Yu, Essex Junction, all of Vt.

[73] Assignee: International Business Machines Corporation, Armonk, N.Y.

[21] Appl. No.: 09/224,826

[22] Filed: Jan. 4, 1999

[51] Int. Cl.$^7$ .................................................. H01L 21/66
[52] U.S. Cl. .............................. 438/16; 257/48; 356/237; 438/424
[58] Field of Search ............................... 438/5, 7, 14, 16, 438/423–426, 945; 136/33.3; 257/48, 922; 356/237, 337, 445

[56] References Cited

U.S. PATENT DOCUMENTS

| | | |
|---|---|---|
| 5,004,340 | 4/1991 | Tullis et al. . |
| 5,076,691 | 12/1991 | Tullis et al. . |
| 5,144,524 | 9/1992 | Tullis et al. . |
| 5,281,850 | 1/1994 | Kanamori . |
| 5,701,174 | 12/1997 | Yeh et al. .............................. 356/237 |
| 5,741,626 | 4/1998 | Jain et al. . |

OTHER PUBLICATIONS

Ogawa e al.; Practical resolution enhancement effect by new complete anti–reflective layer in KrF excimer laser lithography; SPIE vol. 1927, Optical/Laser Microlithography VI, (Feb., 1993), pp. 263–274.

*Primary Examiner*—Tuan H. Nguyen
*Assistant Examiner*—Keith Christianson
*Attorney, Agent, or Firm*—DeLio Peterson, LLC; John J. Tomaszewski; William D. Sabo

[57] ABSTRACT

A method of manufacturing and inspecting SOI such that during STI formation, by depositing a light absorbing layer in the STI such as hydrosilicon oxynitride, the silicon inclusions in the buried insulator layer of the SOI are undetectable by an optical inspection. The reduction in background effects allows for improved optical inspection of SOI wafers without having to discriminate against defects created by SOI formation. A method of manufacturing and inspecting semiconductor devices is disclosed wherein deposition of a light absorbing layer, such as hydrosilicon oxynitride, prevents defects occurring prior to deposition from being optically inspectable and those defects created during the most recent processing can be easily distinguished. Also disclosed are an optically inspectable semiconductor device and an optically inspectable semiconductor device having an STI.

27 Claims, 2 Drawing Sheets

STI FILL FOR SOI WHICH MAKES SOI INSPECTABLE

BACKGROUND OF THE INVENTION

1. Field of the Invention

This invention relates to the field of semiconductor device manufacture, and in particular, to a method of manufacturing semiconductor devices such that the devices are optically inspectable and an optically inspectable semiconductor device.

2. Description of Related Art

During the semiconductor manufacturing process layers of material are deposited on the substrate to form electrical elements thereon. It is necessary and desirable to detect defects which are introduced in a particular process or formation of an electrical device so that continual processing may be avoided prior to correction or removal of the defective wafer in the production line. Optical inspection of the semiconductor device during multiple stages of manufacture enhance the quality of the device as a whole.

Generally, optical inspection tools operate by emitting a beam of light through the transparent or near-transparent substrate or device. Defects within the device reflect light back to a detector located on the inspection tool. It is difficult to discriminate those defects occurring in the most recent stage of manufacturing from those defects which occurred in prior stages.

One example where prior art methods of optical inspection are inadequate is in processing silicon-on-insulator (SOI) wafers produced by oxygen ion implantation. In oxygen ion implantation, a high dose of oxygen is implanted into a silicon wafer. The wafer is subsequently annealed at high temperature whereby the oxygen coalesces to form a silicon dioxide insulator layer buried beneath the silicon surface. A thin single crystal silicon layer, the SOI layer, is then formed above the silicon dioxide insulator.

Annealing the silicon wafer and oxygen produces a number of silicon inclusions located within the bottom of the silicon dioxide insulator layer. They are on the magnitude of $10^4$ or $10^6/cm^2$. These silicon inclusions can be seen using optical inspection tools.

Further processing on an SOI wafer typically involves some form of isolation to separate the electrical elements thereon. A common choice is shallow trench isolation (STI). FIGS. 1 and 2 show a shallow trench isolation manufactured in accordance with prior art methods.

FIG. 1 shows a silicon wafer 3 following oxygen ion implantation to form the buried silicon oxide insulator layer 2. The thin single crystal silicon layer is represented by the number 1. Near the bottom of the insulator layer 2 are a plurality of silicon inclusions 4 formed as a result of the annealing process.

In forming the STI in the SOI wafer, a typical process comprises depositing a sacrificial film such as an oxide and nitride followed by patterning and etching a trench 25 to the buried insulator layer 4. A thin thermal oxide 8 is grown in the walls of trench 25. A second insulating layer 12 such as tetraethylorthosilicate (TEOS), is deposited conformally on the wafer to fill trench 25. Any excess of the second insulating layer is planarized.

Assume the silicon layer of the SOI wafer is 200 nm thick and the optical absorption of silicon at a wavelength of 500 nm is 1.3E-3 [1/nm]. An optical inspection tool such as the KLA 2138 manufactured by KLA/Tencor, 160 Rio Robles, San Jose, Calif. 95134, operating at 490 nm through 650 nm would be able to see the silicon inclusions.

A light having a wavelength of 500 nm emitted by the inspection tool traverses through the 200 nm of silicon, down through the SOI layer, is scattered by the inclusions, and the scattered light passes back through the SOI layer to the detector. The total path length in the silicon is 400 nm. The 500 nm light is attenuated by $I/I_0 = e^{-(1.3E-3)(400)} = 0.6$, a rather small attenuation of the light emitted by the inspection tool.

However, one could prevent the inspection tool from seeing defects below the SOI layer by using light with a short enough wavelength that it is substantially absorbed by the SOI layer. An example would be to use a 365 nm wavelength. The absorption of silicon at 365 nm is 0.1[1/nm], thus in passing through 200 nm of silicon, the light is attenuated to $I/I_0 = e^{(0.1)(400)} = 4.3E10^{-18}$ or substantial absorption of the light. Unfortunately, the defects below the STI region will still be detectable by the inspection tool since the STI region is filled with oxide which is transparent. Defects occurring in subsequent processing must be discriminated against the defects seen below the STI region making inspection difficult.

Bearing in mind the problems and deficiencies of the prior art, it is therefore an object of the present invention to provide a method of manufacturing and optically inspecting silicon wafers wherein defects created by subsequent processing can be distinguished against defects created in prior level processing.

It is another object of the present invention to provide a method of manufacturing and optically inspecting SOI wafers wherein defects created by subsequent processing can be distinguished against defects created in prior level processing.

A further object of the present invention is to provide an optically inspectable semiconductor device.

It is yet another object of the present invention to provide an optically inspectable SOI wafer having an STI.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a process of optically inspecting semiconductor devices comprising the steps of: (a) providing a semiconductor substrate; (b) providing a layer of material capable of masking defects disposed over the semiconductor substrate; (c) providing a layer of material to be inspected disposed over the layer of material capable of masking defects; (d) emitting light through the layers; (e) reflecting a portion of light by any defects in the layer of material to be inspected and attenuating substantially another portion of light by the layer of material capable of masking defects; and (f) detecting any defects in the layer of material to be inspected.

The step of providing a layer of material capable of masking defects may comprise providing an inorganic coating capable of attenuating light disposed over the semiconductor substrate. Preferably, the inorganic coating capable of attenuating light is hydrosilicon oxynitride.

The step of emitting light through the layers disposed on the semiconductor substrate comprises emitting a wavelength of light at about 248 to 400 nm through the layers.

The process of optically inspecting semiconductor devices may further include the step of adjusting the wavelength of light such that the layer of material capable of masking defects attenuates substantially all light emitted through the layer of material capable of masking defects.

In step (e) the layer of material capable of masking defects is attenuating substantially all light passing through the layer of material capable of masking defects such that defects which reflect the light prior to the light reaching the layer of material capable of masking defects are detectable. Step (e) may further comprise attenuating the wavelength of light reflected back from defects occurring prior to deposition of the layer of material capable of masking defects such that the light reflected from the defects are uninspectable.

In another aspect, the present invention is directed to a method of manufacturing and inspecting a semiconductor device comprising the steps of: (a) providing a semiconductor substrate; (b) processing the substrate to form electrical elements thereon; (c) depositing a layer of light absorbing material; (d) continuing processing of the substrate to produce a semiconductor device; (e) inspecting the semiconductor device by emitting a spectrum of light having a wavelength tailored to the light absorbing material such that the light is substantially attenuated as to appear absorbed by the light absorbing material; and detecting any defects in the semiconductor device subsequent to depositing the light absorbing material, the defects reflecting the light; and (f) continuing processing of the semiconductor device based upon inspection of the semiconductor device.

Step (c) may comprise depositing a layer of light absorbing material over a portion of the substrate; depositing an inorganic film capable of withstanding semiconductor processing conditions; or, preferably, depositing a layer of hydrosilicon oxynitride.

During step(e), the layer of light absorbing material is attenuating the emitted light such that only a portion of light which is reflected by defects occurring in continuing processing of the substrate prior to depositing the light absorbing material are undetectable. Inspecting the semiconductor device reveals only those defects which occur subsequent to the step of depositing a layer of light absorbing material.

In yet another aspect, the present invention is directed to a method of fabricating and optically inspecting a semiconductor device having a shallow trench isolation comprising the steps of: (a) providing a silicon on insulator substrate having a first insulative layer and a single crystal layer of silicon formed thereon; (b) depositing a pad dielectric layer onto the silicon layer; (c) patterning and etching a trench for a shallow trench isolation in the pad dielectric layer and the silicon layer exposing the first insulative layer within the silicon on insulator substrate; (d) growing a film of thermal oxide on the walls of the trench; (e) depositing a light absorbing film into the trench; (f) filling the trench with a second insulative layer; (g) removing any excess of the second insulative layer; (h) inspecting the semiconductor device by emitting light having a wavelength which is substantially absorbed by the silicon layer on the silicon on insulator substrate and the light absorbing film; and detecting any defects introduced by the shallow trench isolation and subsequent processing of the semiconductor device due to the reflection of the defects, wherein defects under the light absorbing layer are optically uninspectable.

Step (f) may comprise depositing a layer of TEOS to fill the trench followed by chemical mechanical polishing of the TEOS in step (g).

Step (e) may comprise depositing a hydrosilicon oxynitride film into the trench, preferably, by plasma enhanced chemical vapor deposition.

In still yet another aspect, the present invention is directed to a method of fabricating and inspecting a semiconductor device comprising the steps of: (a) providing a layered semiconductor device having electrical elements thereon; (b) depositing a passivation layer over the semiconductor device; (c) planarizing the passivation layer; (d) depositing a light absorbing film over the planarized passivation layer; (e) forming metallization contacts by etching through the light absorbing layer and the passivation layer; and (f) optically inspecting the semiconductor device, wherein all defects produced prior to deposition of the absorbing film are uninspectable.

Step (c) may comprise chemical mechanical polishing of the passivation layer. Step (d) may comprise depositing a layer of hydrosilicon oxynitride over the planarized passivation layer.

In step (f), the defects from the step of forming metallization contacts can be distinguished from defects from prior processing.

In still yet another aspect, the present invention is directed to an inspectable semiconductor device comprising a semiconductor device having electrical elements thereon; a layer of material capable of masking defects inserted within the layers of the semiconductor device; and a layer of material to be inspected deposited over the layer of material capable of masking defects. Preferably, the layer of material capable of masking defects comprises hydrosilicon oxynitride. Preferably, the layer of material capable of masking defects masks defects occurring in the electrical elements below the layer of material capable of masking defects such that the defects are not inspectable.

In a further aspect, the present invention is directed to an inspectable semiconductor device having a shallow trench isolation comprising a silicon on insulator substrate having a first insulative layer and a single crystal layer of silicon formed thereon; a pad dielectric layer disposed over the silicon layer; a shallow trench isolation etched in the pad dielectric layer and the layer of silicon exposing the first insulative layer; a film of thermal oxide grown into the trench; a light absorbing film deposited into the trench; and a second insulative layer to fill the trench wherein the excess of the second insulative layer is removed, wherein defects under the light absorbing layer are optically inspectable. Preferably, the light absorbing film comprises hydrosilicon oxynitride.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
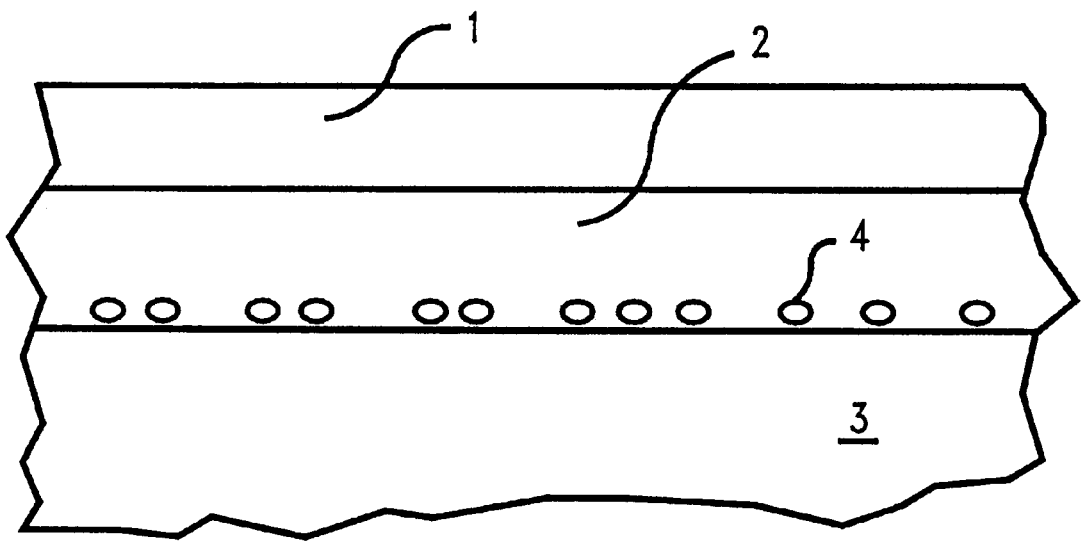
FIG. 1 is an elevational partial side view in cross-section of a SOI wafer in the prior art.

In describing the preferred embodiment of the present invention, reference will be made herein to FIGS. 1–4 of the drawings in which like numerals refer to like features of the invention. Features of the invention are not necessarily shown to scale in the drawings.

Figure 2:
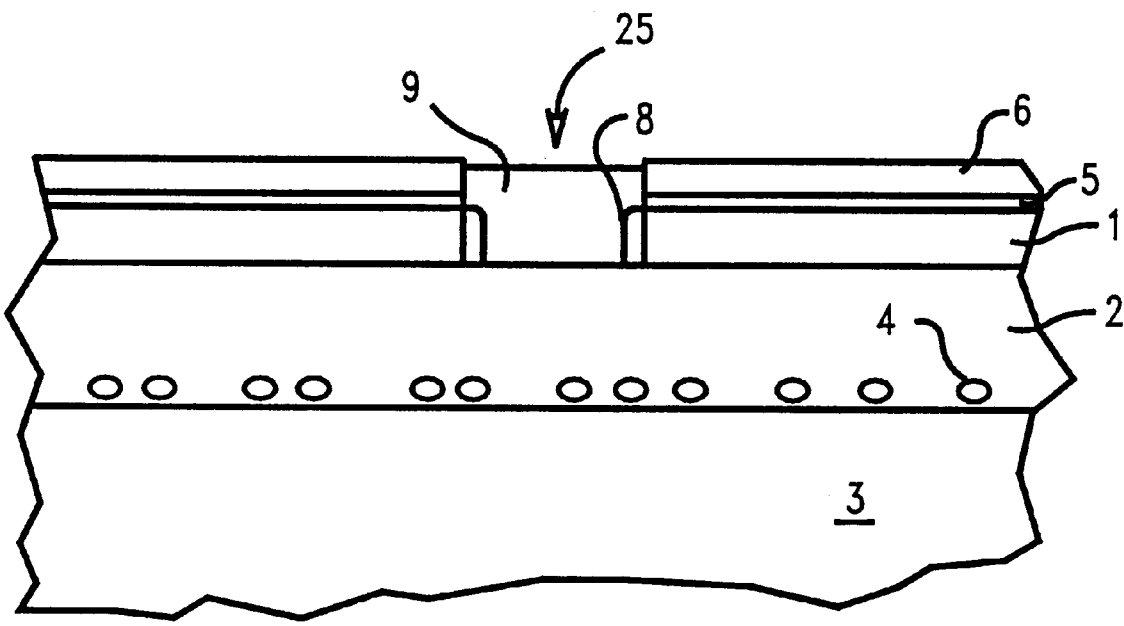
FIG. 2 is an elevational partial side view in cross-section of an SOI wafer having a STI in the prior art.

FIGS. 1 and 2 are SOI wafers known in the prior art and discussed in detail above. The present invention is shown in more detail as FIGS. 3 and 4.

Figure 3:
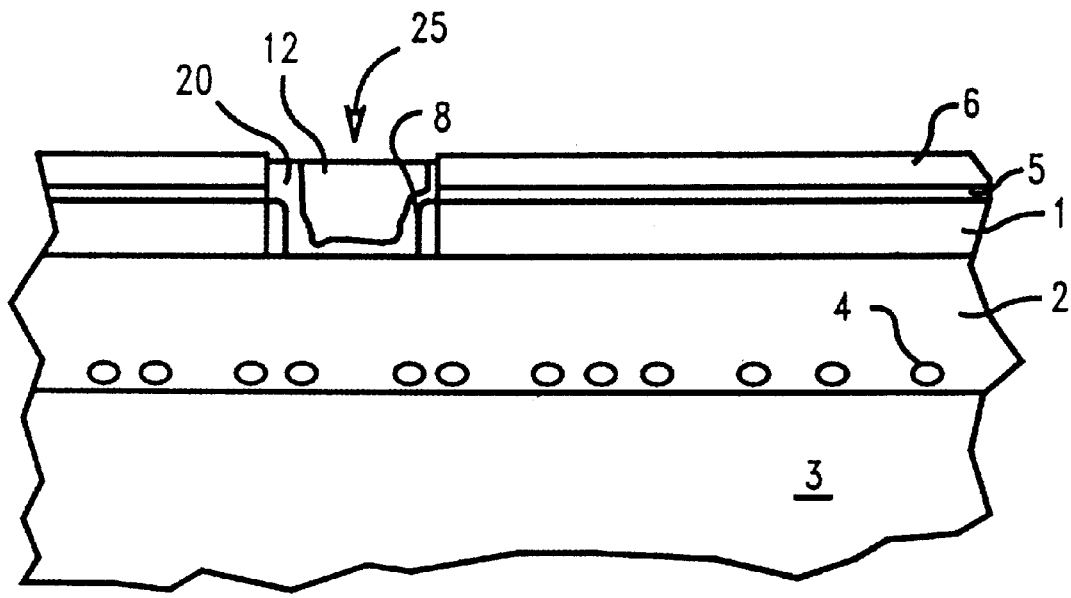
FIG. 3 is an elevational partial side view in cross-section of an inspectable SOI wafer having a STI in accordance to the present invention.

In FIG. 3 is shown a SOI wafer having a STI manufactured in accordance with the present invention. Silicon wafer 3 is implanted with a high dose of oxygen and annealed to form a silicon dioxide insulator layer 2 buried beneath the surface of the silicon wafer 3. A thin single crystal silicon layer 1 is formed above the wafer 3 covering the buried insulator layer 2. Again, silicon inclusions 4 are present in the bottom portion of the buried insulator layer 2.

A STI 25 is formed on the silicon wafer 3. Pad oxide layer 5 and pad nitride layer 6 are deposited onto wafer 3. The oxide, nitride and silicon layers are patterned and etched to form a trench 10 which exposes a portion of buried insulator layer 2. A thin thermal oxide 8 is grown on the walls of the trench 10. This is followed by depositing a light absorbing layer 20 into the trench 10.

Preferably, the light absorbing layer 20 is an inorganic film capable of withstanding the somewhat harsh conditions of further semiconductor processing. Most preferably, the light absorbing layer 20 is hydrosilicon oxynitride having a thickness of about 0.01 to 0.2 μm. Hydrosilicon oxynitride is known in the art for its use in photolithography as referenced in Ogawa et al; *Practical resolution enhancement effect by new complete anti-reflective layer in KrF excimer laser lithography; SPIE Vol. 1927, Optical/Laser Microlithography VI,* (February, 1993), pp. 263–274. A layer of a second insulative material 12 such as tetraethyl orthosilicate (TEOS) is deposited over wafer 3. The excess TEOS is removed by planarization to form the resulting SOI wafer as shown in FIG. 3.

The unexpected advantages of depositing the light absorbing layer is shown by the following example. The optical absorption of the hydrosilicon oxynitride at 365 nm is $5.2E10^{-2}$. The light, in passing through 100 nm of the hydrosilicon oxynitride, scattered by the silicon inclusions, and passing back up through the light absorbing layer again, will be attenuated by $I/I_0 = e^{(5.2E-2)(100)} = 5.7E-3$. Since the light is attenuated to less than 1/100 of its original intensity it will not be seen by the inspection tool. This way the silicon inclusions 4 are undetectable and defects introduced during formation of the STI or subsequent processing are unencumbered by this background.

Figure 4:
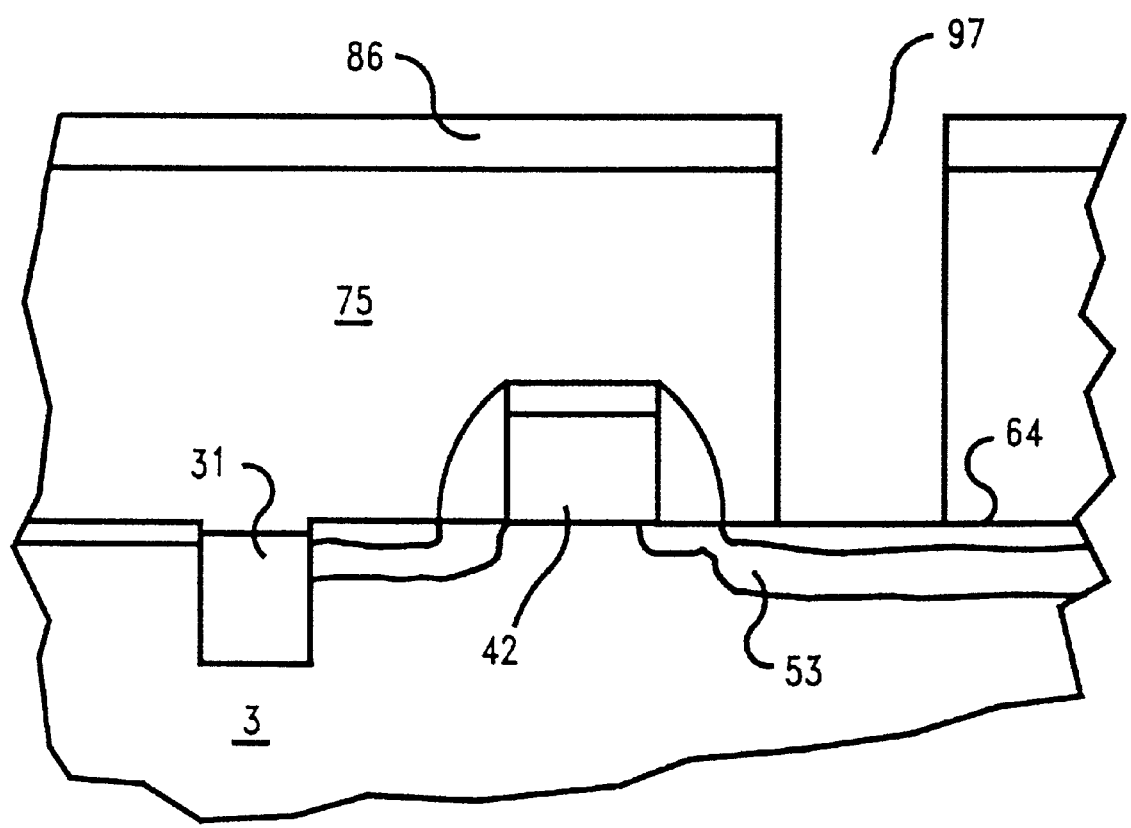
FIG. 4 is an elevational partial side view in cross-section of an inspectable semiconductor wafer in accordance with the present invention.

Another embodiment of the present invention where deposition of a light absorbing layer is beneficial is in standard processes aside from SOI wafers. FIG. 4 shows a standard silicon wafer 3 having, for example, an isolation 31, gate 42, junction 53, and/or a silicide layer 64. Typically, a passivation layer 75 is deposited over the wafer 3 and planarized to give a smooth surface for further processing. Vias or contacts 97 for metallization are patterned and etched into the passivation layer 75.

In order to provide a means for inspecting defects from subsequent metal layers without having to discriminate against defects from prior level processing, a light absorbing layer 86 is deposited over the passivation layer 75. The contacts 97 for metallization can be defined by etching through the light absorbing layer 86 and the passivation layer 75. Once the contact 97 has been filled with a desired metal, further processing can take place without removal of the light absorbing layer 86. The inorganic nature of the material can withstand the harsh conditions of semiconductor processing. Thus, defects introduced prior to deposition of the light absorbing layer will be blocked from inspection.

An unexpected advantage in using a light absorbing layer such as hydrosilicon oxynitride is its ability to withstand semiconductor processing conditions. Once deposited onto the silicon wafer, the hydrosilicon oxynitride does not require removal prior to further processing.

Once the light absorbing layer has been deposited, the metallization formed, and further processing of the silicon wafer is completed, inspection of the semiconductor device can take place. During inspection when the light is emitted through the device, defects created during further processing will be detectable since the defects will reflect a portion of the light back to the detector of the tool. Defects below the light absorbing layer will not be seen by the inspection tool since the light absorbing layer attenuates the light emitted and reflected by any defects to such a degree that it will not be seen by the inspection tool. Thus, defects created during formation of the subsequent metallization layer can be detected without having to discriminate against defects from prior level processing.

The present invention achieves the objects recited above. By depositing a light absorbing layer in the STI of a SOI wafer, silicon inclusions in the buried insulator layer created during the oxygen implantation of the silicon wafer are blocked during optical inspection of the resulting SOI wafer. This reduction in background defects allows for improved optical inspection of SOI wafers without having to discriminate against defects created by STI formation and the inclusions created during oxygen implantation.

The present invention also provides for a method of manufacturing and optically inspecting semiconductor devices. Deposition of the light absorbing layer prevents defects occurring prior to deposition from being optically inspectable such that those defects created during the most recent processing can be easily distinguished. The light absorbing layer may cover all or a portion of a semiconductor wafer during the manufacturing process depending on the desired inspection site.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A process of optically inspecting semiconductor devices comprising the steps of:

(a) providing a semiconductor substrate;

(b) providing a layer of material capable of masking defects disposed over said semiconductor substrate;

(c) providing a layer of material to be inspected disposed over said layer of material capable of masking defects;

(d) emitting light through said layers;

(e) reflecting a portion of light by any defects in said layer of material to be inspected and attenuating substantially another portion of light by said layer of material capable of masking defects; and (f) detecting any defects in said layer of material to be inspected.

2. The process according to claim 1, wherein step (b) comprises providing an inorganic coating capable of attenuating light disposed over said semiconductor substrate.

3. The process according to claim 2, wherein step (b) comprises providing a layer of hydrosilicon oxynitride disposed over said semiconductor substrate.

4. The process according to claim 1, wherein step (d) comprises emitting a wavelength of light at about 248 to 400 nm through said layers.

5. The process according to claim 1, further including the step of adjusting the wavelength of light such that said layer of material capable of masking defects attenuates substantially all light emitted through said layer of material capable of masking defects.

6. The process according to claim 1, in step (e) wherein said layer of material capable of masking defects is attenuating substantially all light passing through said layer of material capable of masking defects such that defects which reflect the light prior to the light reaching said layer of material capable of masking defects are detectable.

7. The process according to claim 6, in step (e) further comprising attenuating the wavelength of light reflected back from defects occurring prior to deposition of said layer of material capable of masking defects such that the light reflected from the defects are uninspectable.

8. A method of manufacturing and inspecting a semiconductor device comprising the steps of:
    (a) providing a semiconductor substrate;
    (b) processing said substrate to form electrical elements thereon;
    (c) depositing a layer of light absorbing material;
    (d) continuing processing of said substrate to produce a semiconductor device;
    (e) inspecting said semiconductor device by
        (i) emitting a spectrum of light having a wavelength tailored to said light absorbing material such that the light is substantially attenuated as to appear absorbed by said light absorbing material; and
        (ii) detecting any defects in said semiconductor device subsequent to depositing said light absorbing material, said defects reflecting the light; and
    (f) continuing processing of said semiconductor device based upon inspection of said semiconductor device.

9. The method according to claim 8, wherein step (c) comprises depositing a layer of light absorbing material over a portion of said substrate.

10. The method according to claim 8, in step (e) said layer of light absorbing material is attenuating the emitted light such that only a portion of light which is reflected by defects occurring in continuing processing of said substrate prior to depositing said light absorbing material are undetectable.

11. The method according to claim 8, in step (e) inspecting said semiconductor device reveals only those defects which occur subsequent to said step of depositing a layer of light absorbing material.

12. The method according to claim 8, wherein step (c) comprises depositing an inorganic film capable of withstanding semiconductor processing conditions.

13. The method according to claim 12, wherein step (c) comprises depositing a layer of hydrosilicon oxynitride.

14. A method of fabricating and optically inspecting a semiconductor device having a shallow trench isolation comprising the steps of:
    (a) providing a silicon on insulator substrate having a first insulative layer and a single crystal layer of silicon formed thereon;
    (b) depositing a pad dielectric layer onto said silicon layer;
    (c) patterning and etching a trench for a shallow trench isolation in said pad dielectric layer and said silicon layer exposing the first insulative layer within said silicon on insulator substrate;
    (d) growing a film of thermal oxide on the walls of said trench;
    (e) depositing a light absorbing film into said trench;
    (f) filling said trench with a second insulative layer;
    (g) removing excess of said second insulative layer;
    (h) inspecting said semiconductor device by
        emitting light having a wavelength which is substantially absorbed by said silicon layer on said silicon on insulator substrate and said light absorbing film; and
        detecting any defects introduced by the shallow trench isolation and subsequent processing of said semiconductor device due to the reflection of said defects,
wherein defects under said light absorbing layer are optically uninspectable.

15. The method according to claim 14, wherein step (f) comprises depositing a layer of tetraethylorthosilicate to fill said trench.

16. The method according to claim 14, wherein step (g) comprises chemical mechanical polishing of said tetraethylorthosilicate.

17. The method according to claim 14, wherein step (e) comprises depositing a hydrosilicon oxynitride film into said trench.

18. The method according to claim 17, wherein step (e) comprises plasma enhanced chemical vapor deposition of said hydro silicon oxynitride into said trench.

19. A method of fabricating and inspecting a semiconductor device comprising the steps of:
    (a) providing a layered semiconductor device having electrical elements thereon;
    (b) depositing a passivation layer over said semiconductor device;
    (c) planarizing said passivation layer;
    (d) depositing a light absorbing film over said planarized passivation layer;
    (e) forming metallization contacts by etching through said light absorbing layer and said passivation layer; and
    (f) optically inspecting said semiconductor device,
wherein all defects produced prior to deposition of the absorbing film are uninspectable.

20. The method according to claim 19, wherein step (c) comprises chemical mechanical polishing of said passivation layer.

21. The method according to claim 19, wherein step (d) comprises depositing a layer of hydrosilicon oxynitride over said planarized passivation layer.

22. The method according to claim 19, in step (f) wherein defects from said step of forming metallization contacts can be distinguished from defects from prior processing.

23. An optically inspectable semiconductor device comprising:
    a semiconductor device having electrical elements thereon;
    a layer of material capable of masking defects inserted within the layers of said semiconductor device; and
    a layer of material to be inspected deposited over said layer of material capable of masking defects.

24. The semiconductor device according to claim 23, wherein said layer of material capable of making defects comprises hydrosilicon oxynitride.

25. The semiconductor device according to claim 23, wherein said layer of material capable of masking defects masks defects occurring in the electrical elements below said layer of material capable of masking defects such that said defects are not inspectable.

26. An optically inspectable semiconductor device having a shallow trench isolation comprising:

a silicon on insulator substrate having a first insulative layer and a single crystal layer of silicon disposed thereon;

a pad dielectric layer disposed over said silicon layer;

a shallow trench isolation etched in said pad dielectric layer and said silicon layer exposing said first insulative layer;

a film of thermal oxide grown into said trench;

a light absorbing film deposited into said trench; and a second insulative layer to fill said trench wherein the excess of said second insulative layer is removed, wherein defects under said light absorbing layer are optically inspectable.

27. The semiconductor device having a shallow trench isolation according to claim 26, wherein said light absorbing film comprises hydrosilicon oxynitride.

* * * * *